(12) United States Patent
Seo

(10) Patent No.: US 7,692,980 B2
(45) Date of Patent: Apr. 6, 2010

(54) METHOD OF AND APPARATUS FOR READING DATA

(75) Inventor: Yoon-bum Seo, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 103 days.

(21) Appl. No.: 12/133,702

(22) Filed: Jun. 5, 2008

(65) Prior Publication Data

US 2009/0168559 A1    Jul. 2, 2009

(30) Foreign Application Priority Data

Dec. 27, 2007   (KR) .................. 10-2007-0138600

(51) Int. Cl.
    *G11C 7/22*   (2006.01)
(52) U.S. Cl. ............... 365/189.15; 365/194; 365/233.1

(58) Field of Classification Search ........... 365/189.15, 365/194, 233.1
See application file for complete search history.

(56) References Cited

U.S. PATENT DOCUMENTS 6,427,197 B1 *  7/2002  Sato et al. ................. 365/194
6,512,719 B2 *  1/2003  Fujisawa et al. ....... 365/189.15

\* cited by examiner

*Primary Examiner*—Huan Hoang
(74) *Attorney, Agent, or Firm*—Sughrue Mion, PLLC

(57) ABSTRACT

Provided are an apparatus and a method of capturing data by using a data transition of a data signal. The method includes detecting a data transition of a data signal input from an external source, generating a pulse signal corresponding to the detected data transition, and capturing the data signal by using the generated pulse signal as a trigger. Accordingly, stable capturing of data can be performed without changes in margins even when data bits of the read data enter a controller at different times due to skews.

17 Claims, 7 Drawing Sheets

METHOD OF AND APPARATUS FOR READING DATA

CROSS-REFERENCE TO RELATED PATENT APPLICATION

This application claims priority from Korean Patent Application No. 10-2007-0138600, filed on Dec. 27, 2007, in the Korean Intellectual Property Office, the disclosure of which is incorporated herein in its entirety by reference.

BACKGROUND OF THE INVENTION

1. Field of the Invention

Apparatuses and method consistent with the present invention relate to reading data, and more particularly, to capturing data by using a data transition of a data signal.

2. Description of the Related Art

Most digital devices today use low-cost Synchronous Dynamic Random Access Memory (SDRAM) as their main storage device. The greater number of SDRAM usage led to a greater capacity of SDRAM, which in turn led to a realization of high-speed actions. Thus, necessary timing for input/output (I/O) has become a very important issue.

When reading data, related art SDRAMs transmit data signals DQ and data strobe signals DQS of identical phase to hosts.

Thus, most controllers shift the data strobe signals DQS by 90° or 120° to delay the data strobe signals DQS. Then, the controllers directly capture the read data from SDRAM by using the delayed data strobe signals DQS as a trigger.

Such methods are used for disposing the transition of the data strobe signals DQS at a center between the transitions of the read data. This allows an equal division of setup margin and hold margin of the data signals DQ produced by the data strobe signals DQS, providing maximum margin for both transitions.

The setup margin indicates a time margin between a time point where data transition, that is, a status transformation of data, is generated and a point where a reading operation is generated. The hold margin refers to a time margin between a point where data is read and a point where the next state transformation of data takes place.

The reason behind the maximum procurement of the setup margin/hold margin of the read data is to prevent interference to the reading process caused by instantaneous noise due to an unstable routing path entering a flip-flop (F/F) through I/O from a pin.

To use the conventional technology, as described in FIG. 1, a delicate delay line, and a clock synchronizing module such as a delay locked loop (DLL) that produces a 90° or 120° delay by measuring a period of an external data strobe signal or a clock (CLK) are necessary for delaying the data strobe signal DQS.

FIG. 1 is a block diagram illustrating a general data strobe signal DQS control device for reading external data, according to a conventional technology.

Referring to FIG. 1, the general data strobe signal DQS control device comprises a delay locked loop (DLL) 110, a control unit 120, a delay line 130, and a flip-flop (F/F) 140.

General data strobe signal DQS control devices may be included in a memory controller. External data signals DQ and data strobe signals DQS are generally transmitted to a memory controller from SDRAM at identical phases.

Thus, memory controllers use the data strobe signals DQS to latch the transmitted external data signals. The data strobe signals have identical phase as external data signals. Therefore, data strobe signal DQS control devices shift the data strobe signals DQS for certain time period and latch the external data with the data strobe signals that have been shifted. For example, in a read process of double data rate (DDR) SDRAM, the data strobe signals DQS must be shifted by 90° to optimize the setup margin and holdup margin of the data.

The DLL 110 receives a system clock or a data strobe signal DQS from an external source, measures a period of the received system clock or data strobe signal DQS, and outputs the measured periods. The output of the DLL 110 may be represented in the unit of the number of delay chains included in the DLL 110, that is, as the number of taps.

The control unit 120 receives the period of the system clock or the data strobe signal DQS from the DLL 110 and determines the delay length of the data strobe signal DQS to optimize the setup margin and hold margin of the data. For example, a 90° delay is adequate for DDR SDRAMs. In such a case, the DLL 110 counts the number of delay chains regarding 1 cycle (360°) of the data strobe signal DQS and the control unit 120 multiplies the number of delay chains regarding 1 cycle by ¼ to compute the number of delay chains required for the 90° shift of the data strobe signal DQS.

The delay line 130 delays the data strobe signal DQS according to the delay length determined by the control unit 120.

The flip-flop (F/F) 140 latches external data by using the system clock or data strobe signal that has been output after being delayed at the delay line 130 as a trigger signal, and outputs the read data.

FIG. 2 is a time graph illustrating capturing of data signals by using delayed data strobe signals DQS. FIG. 3 is a diagram illustrating a skew generated from data signals DQ and data strobe signals DQS.

Referring to FIG. 2, data reading executed through the device of FIG. 1 is illustrated in a time graph. As illustrated in FIG. 2, a data strobe signal DQS that is delayed by 90° is used as a trigger signal to capture the data signal DQ at a point where the data strobe signal undergoes transition.

However, as can be seen in FIG. 3, skews may be generated among data signals DQ or among a data signal DQ and a data strobe signal DQS. Skews generated from routing among a data signal DQ and a data strobe signal DQS are usually caused by instability of I/O voltage or cross-talk among bits. Therefore, skews generating from the internal signals may cause a transformation of setup margin/hold margin of data, and thereby make the reading process unstable.

Referring back to FIG. 2, dot-lined zone 210 illustrates a failed data capture. When using a data strobe signal DQS that is delayed by 90° as a trigger, skew is generated in the data signal DQ as shown in the dot-lined zone 210, causing a worsening of the margin. This in turn causes a failure in capturing the data signal DQ at an accurate timing.

Locking of a margin resulting from skews among data signals DQ or skews among a data signal DQ and a data strobe signal DQS during a data reading is essential; however, locking of a clock or a data strobe signal occurs at an idle state of the system. Therefore, the methods described above can be disadvantageous for not being able to lock the worsening of margins in real time.

Furthermore, in actual chips, skews among data signals DQ resulting from fluctuations in a power level, fluctuations in a reference voltage (VREF), skews among routing, or crosstalks of a data signal occur frequently, and the numerical values of the skews fluctuate frequently.

The skews generated in the methods described above worsen the setup margin or hold margin of the flip-flop of a controller interface. When data transition rate increases, the skews also become greater due to increased instability of I/O voltage level and influences of cross-talk among data.

Therefore, if skews among data bits or skews among a data strobe signal DQS and a data signal DQ change drastically, it becomes very difficult or impossible to increase the setup margin and hold margin of all data bits to their maximum, regardless of the delay location of the data strobe signals DQS.

Furthermore, when the clock's duty ratio changes due to jitters of the clock signal, a duty ratio of the data strobe signals DQS also changes, causing a problem even where the data strobe signal is delayed by 90° or 120°.

In addition, a measurement of a delay length of 90° or 120° of the data strobe signal DQS is a value set by only measuring a period of the clock or data strobe signal DQS. Thus, skews among data signals DQ, skews among data signals DQ and clock, or skews among data signals DQ and data strobe signals DQS cannot be measured, thereby causing a problem.

SUMMARY OF THE INVENTION

To address the above and/or other problems, exemplary embodiments of the present invention provide a method of and apparatus for capturing data by detecting data transition among data signals DQ.

According to an aspect of the present invention, there is provided a data reading method including detecting a data transition of a data signal input from an external source; generating a pulse signal corresponding to the detected data transition; and capturing the data signal by using the generated pulse signal as a trigger.

The generating of the pulse signal may include determining a setup time, which is an interval between a point in time of detecting the data transition and a point in time of capturing the data signal.

The setup time may be determined based on one of a buffer delay and an inverter delay.

The method may further include inverting the generated pulse signal, and the capturing of the data signal may use a rising edge of the inverted pulse signal as the trigger.

The method may further include generating an initial pulse signal at a preamble period within a predetermined amount of time after a read command of the data signal is input.

The generating of the initial pulse signal may generate the initial pulse signal by corresponding to a preamble signal within a Column Address Strobe (CAS) delay time (Column Address Strobe Latency (CL)) after the read command is input.

According to another aspect of the present invention, there is provided a data reading apparatus including a data transition detecting unit generating a pulse signal by detecting a data transition of a data signal input from an external source; and a data capturing flip-flop unit capturing the data signal by receiving the generated pulse signal as a trigger.

The data transition detecting unit may further include a pulse signal generating unit generating the pulse signal corresponding to the detected data transition.

The pulse signal generating unit may further include a setup time computing unit determining a setup time, which is an interval between a point where the data transition is detected and a point where the data signal is captured.

The setup time may be determined based on a buffer delay or an inverter delay.

The pulse signal generating unit may further include an inverter inverting the generated pulse signal.

The data capturing flip-flop unit may use a rising edge of the inverted pulse signal as a trigger to capture the data signal.

The data reading apparatus may further include an initial pulse signal generating unit generating an initial pulse signal at a preamble period within a predetermined amount of time after a read command of the data signal is input.

The initial pulse signal generating unit may generate the initial pulse signal by corresponding to a preamble signal within a CAS delay time (CL) after the read command is input.

The data reading apparatus may further include a data strobe signal detecting unit detecting data strobe signals (Data Queue Strobe (DQS)) generated from the read command.

According to another aspect of the present invention, there is provided a computer readable recording medium having recorded thereon a program for realizing a data reading method including detecting a data transition of a data signal input from an external source; generating a pulse signal corresponding to the detected data transition; and capturing the data signal by using the generated pulse signal as a trigger.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF EXEMPLARY EMBODIMENTS OF THE INVENTION

Figure 1:
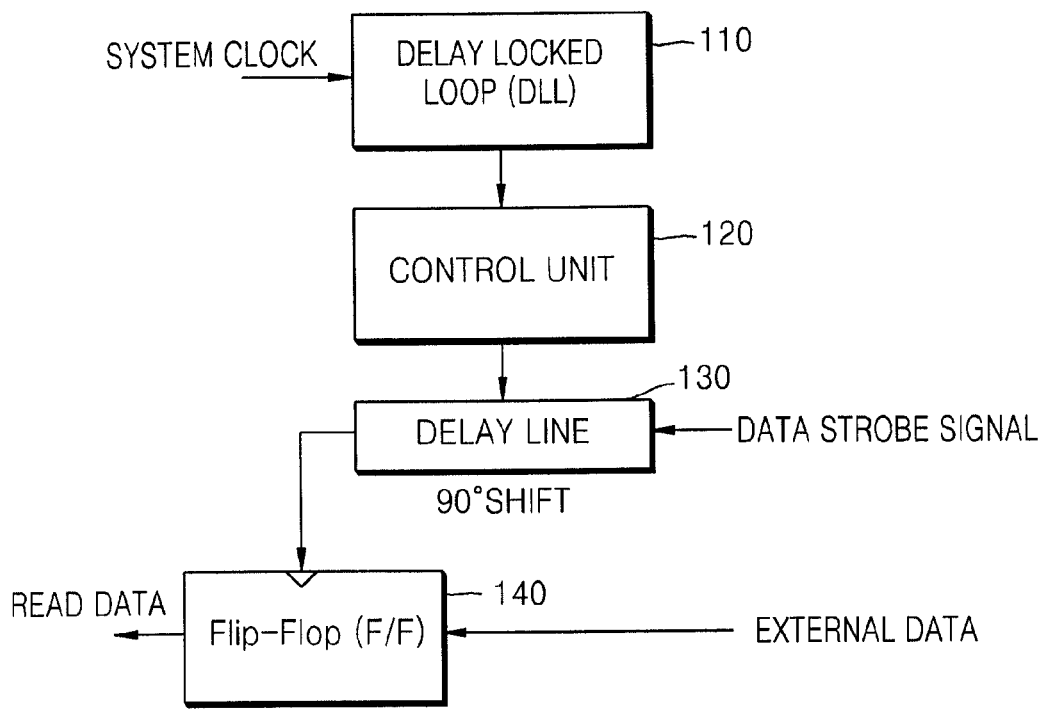
FIG. 1 is a block diagram illustrating a general data strobe signal DQS control device for reading external data, according to a conventional technology.
Figure 2:
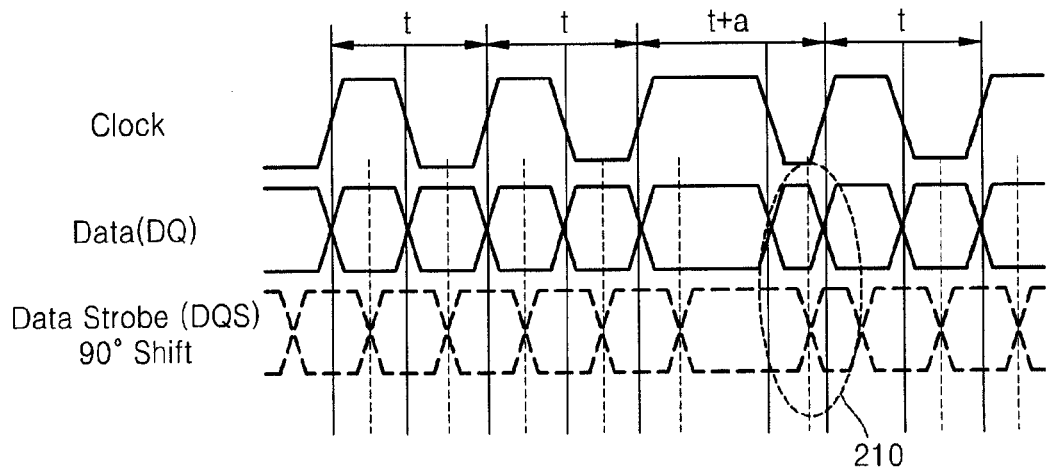
FIG. 2 is a time graph illustrating capturing of data signals by using delayed data strobe signals, according to a conventional technology.
Figure 3:
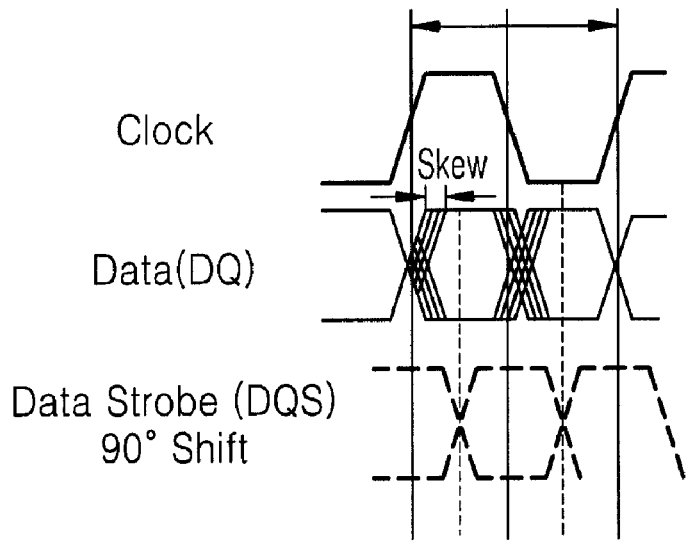
FIG. 3 is a diagram illustrating a skew generated from data signals DQ and data strobe signals DQS.

A computer reading medium and method of and apparatus for reading data according to exemplary embodiments of the present invention will now be described more fully with reference to the accompany drawings in which exemplary embodiments of the invention are shown. In the drawings, certain areas are exaggerated for clarity, and like reference numerals refer to like elements.

Figure 4:
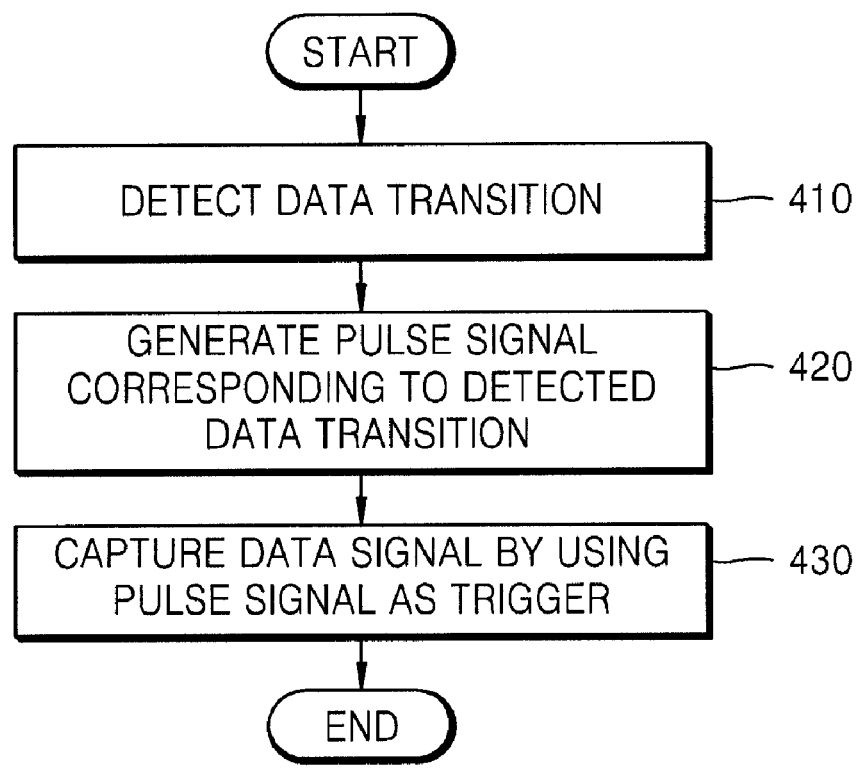
FIG. 4 is a flowchart for explaining a data reading method using a data transition of a data signal, according to an exemplary embodiment of the present invention.

FIG. 4 is a flowchart for explaining the data reading method using a data transition of a data signal DQ, according to an exemplary embodiment of the present invention.

Referring to FIG. 4, the data reading method of an exemplary embodiment of the present invention comprises detecting the data transition 410 of the data signal DQ input from an external source, generating a pulse signal corresponding to the detected data transition 420, and capturing the data signal DQ by using the generated pulse signal as a trigger 430.

The data strobe signal DQS illustrates a valid status of the data and an order of a burst data, but does not have to capture the data as a data strobe signal.

Capturing data by delaying the data strobe signal DQS by 90° or 120° places the data strobe signal DQS at a center between data transitions, which allows maximized setup margin/hold margin. Thus, this can be an advantageous data capturing method when considering ideal timing. However, as described above, maintaining the delay location of the data strobe signals DQS to provide margins of maximum timing is difficult, which further leads to problems.

An exemplary embodiment of the present invention detects data transition (410) and uses a signal of the detected data transition as a trigger signal of a flip-flop. Thus, a pulse signal is generated (420) to detect a transition of a data signal DQ and to use the detected data transition as the trigger signal. The generation of the pulse signal (420) can further comprise determining a setup time, an interval between a point of detecting a data transition and a point of capturing the data signal DQ. The setup time is computed with a buffer delay or an inverter delay.

Thus, the generated pulse signal is input as a trigger signal at a clock pin of the flip-flop instead of the data strobe signal DQS. The flip-flop uses the generated pulse signal to capture data signals DQ (430).

Regarding such a data reading method, effects of skews of each data bit can be eliminated, and effects of skews of data signals DQ and data strobe signals DQS can be eliminated. Furthermore, blocks that are large in size and sensitive to processes such as conventional DLL can be eliminated, and locking is only possible at refresh or idle states for conventional methods, which produces different setup margins/hold margins of data each time. The present invention provides identical setup margins.

A data reading method according to an exemplary embodiment of the present invention is described in detail below with reference to different time graphs.

Figure 5:
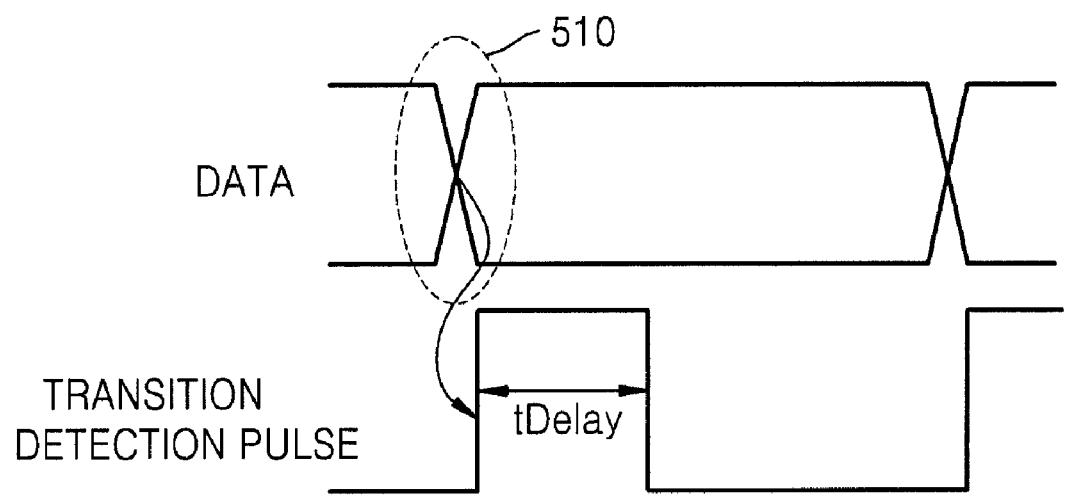
FIG. 5 is a timing graph illustrating a pulse signal corresponding to a data transition of a data signal DQ, according to an exemplary embodiment of the present invention.
Figure 6:
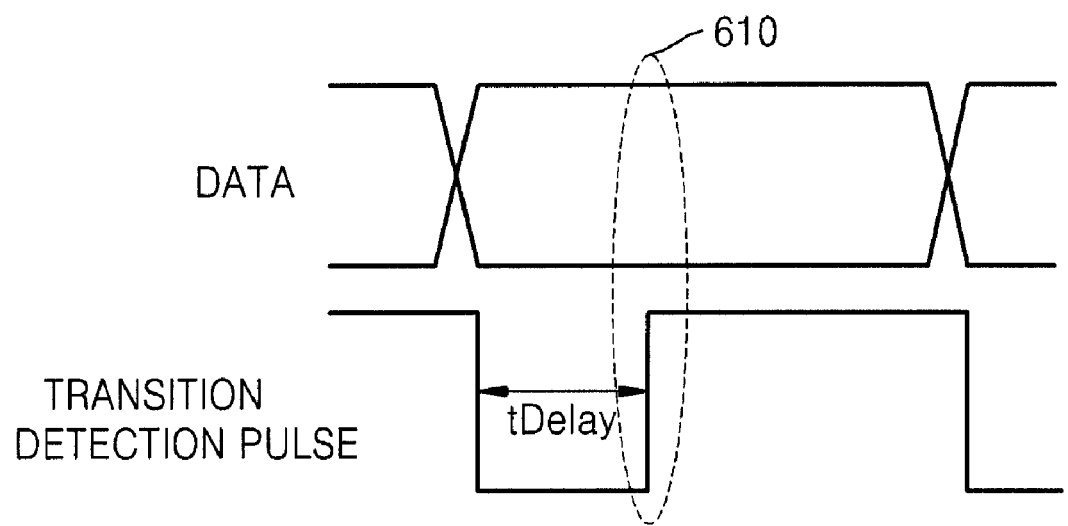
FIG. 6 is a timing graph illustrating a pulse signal that is inverted corresponding to a data transition of a data signal, according to an exemplary embodiment of the present invention.

FIG. 5 is a time graph illustrating a pulse signal corresponding to a data transition of a data signal DQ, according to an exemplary embodiment of the present invention, and FIG. 6 is a time graph illustrating an inverted pulse signal corresponding to a data transition of a data signal DQ, according to another exemplary embodiment of the present invention.

Referring to FIG. 5, a transition detection pulse indicates a pulse signal that is generated by detecting a transition of a data signal DQ at an interval 510.

tDelay indicates a width of the generated pulse signal referring to an interval that determines a setup time, which is an interval between a point of detecting a data transition and a point of capturing a data signal DQ. The tDelay is processed at a setup time computing unit 1011-1 included in a pulse signal generating unit 1011 of a data transition detecting unit 1010 described in a data reading apparatus of FIG. 10. Referring to FIG. 11, which is a circuit diagram illustrating an example of the data reading apparatus of FIG. 10, tDelay can be determined by a buffer delay or an inverter delay.

Once the flip-flop determines the setup time for capturing data, the rest of the time is hold time. Thus, tDelay can be determined to provide maximum margin by appropriately distributing the hold time.

Referring to FIG. 6, a data reading method of an exemplary embodiment of the present invention can further comprise inverting the generated pulse signal. For example, the pulse signal of FIG. 6 holds an inverted configuration as compared to the pulse signal as shown in FIG. 5.

Thus, capturing of a data signal DQ 430 by using the generated pulse signal of FIG. 4 as a trigger signal can be used to capture data at a corresponding point by using a rising edge 610 of the inverted pulse signal as the trigger signal, as illustrated in FIG. 6.

Thus, data can be captured with a transition detection pulse, rather than a delayed data strobe signal DQS.

Figure 7:
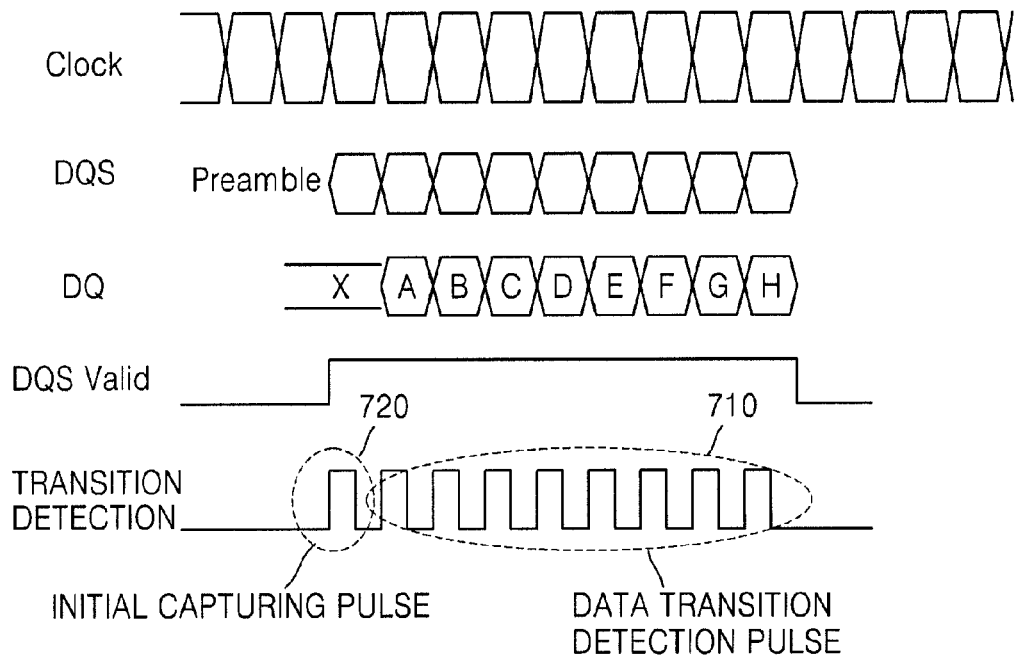
FIG. 7 is a timing graph illustrating capturing of data signals using a data transition of a data signal DQ, according to an exemplary embodiment of the present invention.

FIG. 7 is a time graph illustrating capturing of data with a data transition of a data signal DQ, according to an exemplary embodiment of the present invention.

Referring to FIG. 7, capturing of a burst data A to H when the data signal DQ comprises the burst data A to H is illustrated. According to an exemplary embodiment of the present invention, data strobe signals are only used for indicating a data valid state. The data valid state is indicated as DQS valid.

Referring to dot-lined zone 710, a trigger signal capturing an 8-bit data (A to H) via the pulse signal, namely, transition detection pulse can be noted. Another dot-lined zone 720 illustrates an initial capturing pulse, which is explained by referring to FIG. 8.

Figure 8:
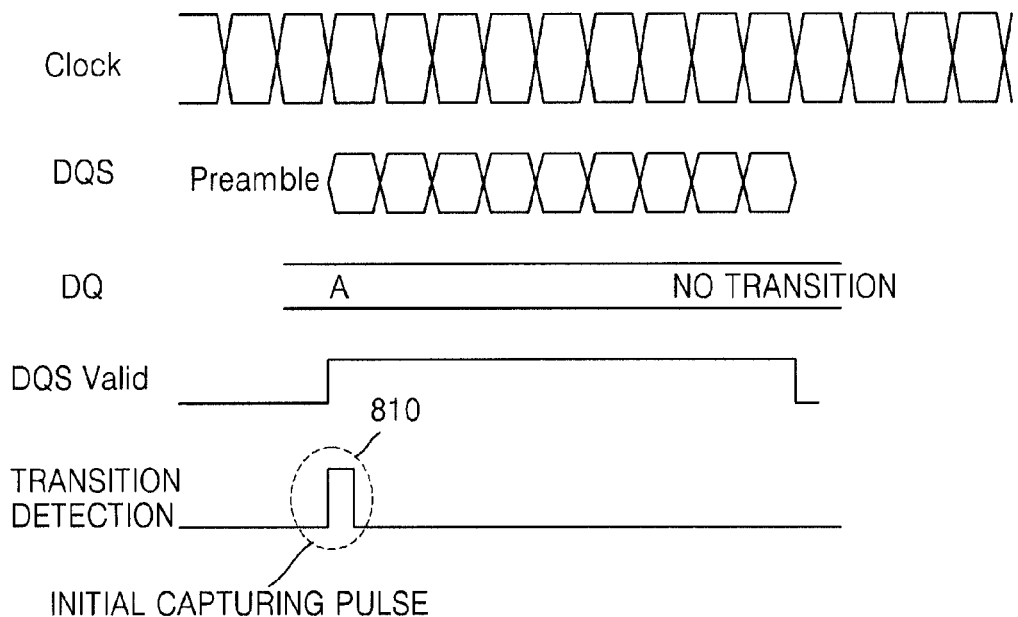
FIG. 8 is a timing graph illustrating capturing of data signals without a data transition of a data signal, according to an exemplary embodiment of the present invention.

FIG. 8 is a time graph illustrating capturing of data without a data transition of a data signal DQ, according to an exemplary embodiment of the present invention.

Even if a data strobe signal DQS is generated to indicate a valid status, if data transition is absent, then a problem can occur. Referring to FIG. 8, there is no transition of a data signal DQ.

In such a case, if data transition is absent from the beginning of a reading, then a read failure may occur because a last read data of a burst data is stored on the flip-flop.

Thus, an initial transition detection pulse must be generated by force at a preamble period when reading. The initial transition detection pulse is referred to as an initial capturing pulse 810 in FIG. 8.

Therefore, a data reading method of an exemplary embodiment of the present invention can further comprise generating an initial signal at a preamble period within a fixed amount of time after a read command for a data signal is input. Thus, after waiting for CAS delay time (Column Address Strobe Latency time (tCL)) since the moment the read command is input, the initial capturing pulse 810 is generated when the preamble is output from SDRAM.

Figure 9:
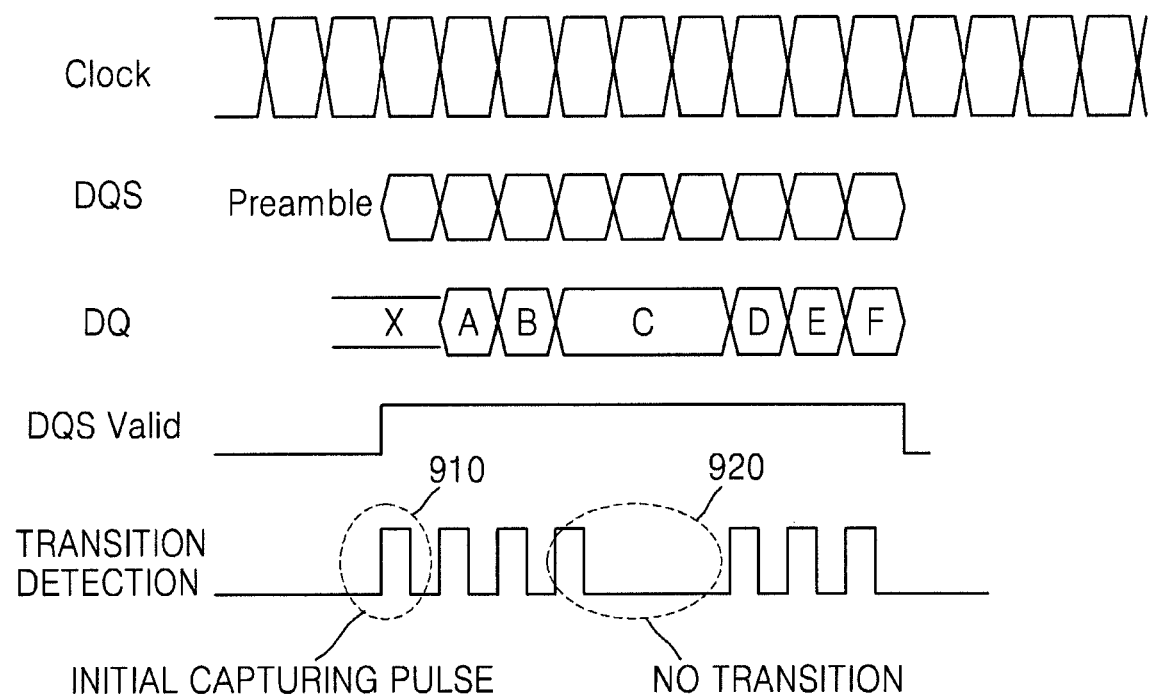
FIG. 9 is a time graph illustrating capturing of data signals without a data transition of a data signal DQ, according to another exemplary embodiment of the present invention.

FIG. 9 is a time graph illustrating capturing of data without a data transition of a data signal DQ, according to an exemplary embodiment of the present invention.

Referring to FIG. 9, the initial capturing pulse 910 is similar to that of FIG. 8. However, data transition does not occur for a certain time period with data C, illustrating a case 920 where transition detection pulse is not generated. In such a case, read data before and after the read are identical to C, not generating the problem of FIG. 8.

Figure 10:
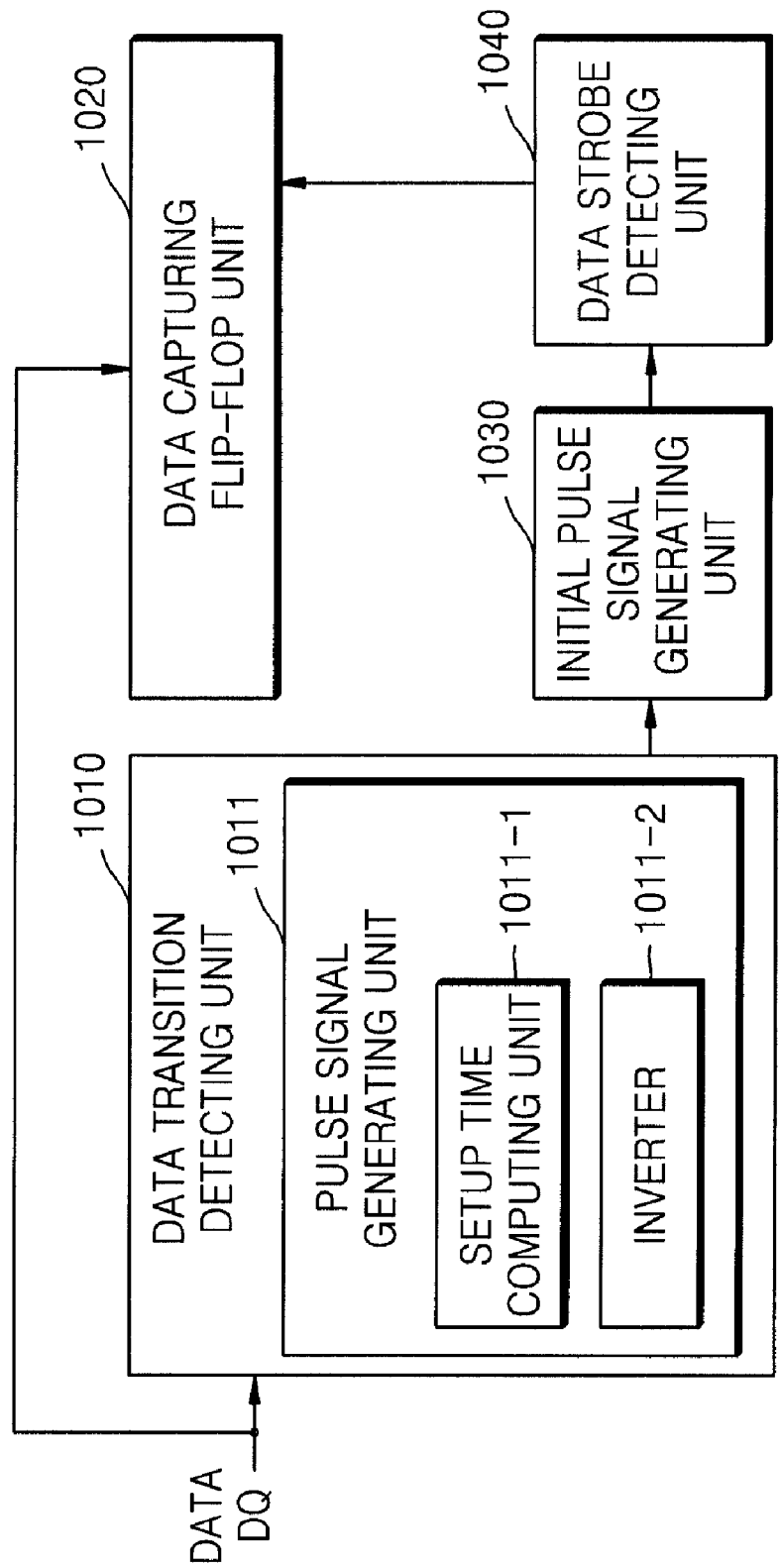
FIG. 10 is a functional block diagram illustrating a data reading apparatus using a data transition of a data signal DQ, according to an exemplary embodiment of the present invention.
Figure 11:
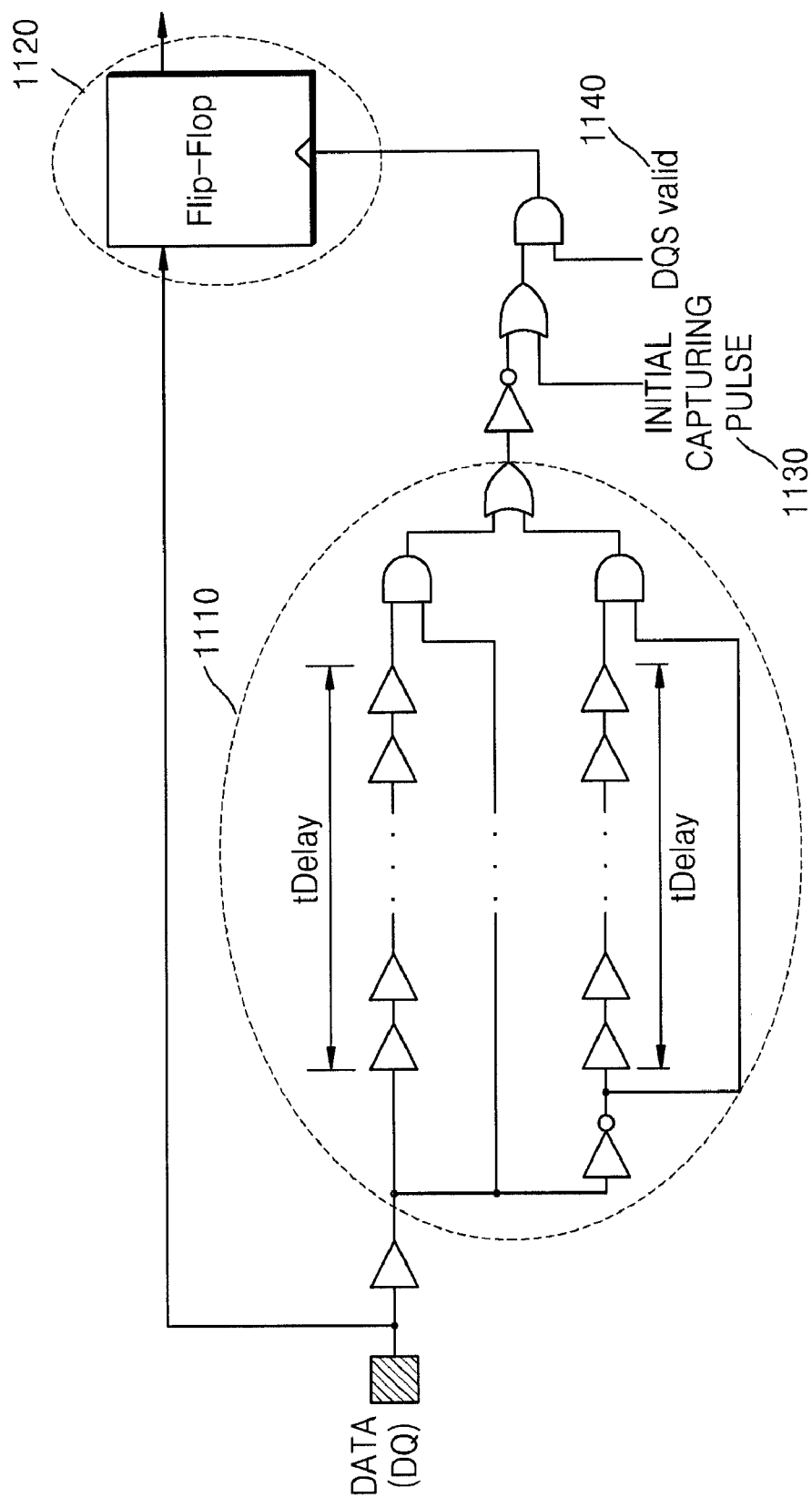
FIG. 11 is a circuit diagram illustrating an example of a data reading apparatus using a data transition of a data signal, according to an exemplary embodiment of the present invention.

FIG. 10 is a functional block diagram illustrating a data reading apparatus using a data transition of a data signal DQ, according to an exemplary embodiment of the present invention.

Referring to FIG. 10, the data reading apparatus comprises a data transition detecting unit 1010 detecting data transition from data input from an external source and a data capturing flip-flop unit 1020 capturing the data signals after receiving the generated pulse signals as a trigger signal.

Furthermore, the data transition detecting unit 1010 can further comprise a pulse signal generating unit 1011 generating pulse signals corresponding to the detected data transition. The pulse signal generating unit 1011 can further comprise a setup time computing unit 1011-1 determining a setup time, which is an interval between a point where a data transition is detected and a point where a data signal is captured, and an inverter 1011-2 inverting the generated pulse signals.

The data reading apparatus can further comprise an initial pulse signal generating unit 1030 generating initial pulse signals at a preamble period within a CAS delay time (tCL) after a read command of a data signal is input, and a data strobe detecting unit 1040 detecting data strobe signals DQS resulting from a read command.

FIG. 11 is a circuit diagram illustrating an example of a data reading apparatus using a data transition of a data signal DQ, according to an exemplary embodiment of the present invention.

In FIG. 11, a module 1110 corresponding to a data transition detecting unit 1010 for generating a pulse signal by detecting a data transition of a data signal DQ input from an external source, a module 1120 corresponding to a data capturing flip-flop unit 1020 capturing data signals by receiving pulse signals as a trigger signal, and a data strobe signal (DQS valid) 1140 indicating an initial pulse signal 1130 and data valid are illustrated.

Meanwhile, the data reading method of exemplary embodiments of the present invention can be written as a program that can be run on a computer, and the data reading method can be realized on a general-purpose computer running the program by using a recording medium that can be read on a computer.

Furthermore, a data structure used in an exemplary embodiment of the present invention can be recorded on a recording medium that can be read on a computer via numerous methods.

According to the data reading method and apparatus of exemplary embodiments of the present invention, data can be captured without changes in margins even if bits of the read data enter a controller at different times. Thus, an additional clock synchronizing module is not necessary even if a high-speed memory is used, and stable data reading can be performed.

The recording medium that can be read by a computer comprises a magnetic storage medium (for example, ROMs, floppy disks, hard disks etc.), and an optical reading medium (for example, CD ROMs, D-Drives etc.).

While the present invention has been particularly shown and described with reference to exemplary embodiments thereof, it will be understood by those skilled in the art that various changes in form and details may be made therein without departing from the spirit and scope of the invention as defined in the appended claims. The exemplary embodiments should be considered in descriptive sense only and not for purposes of limitation. Therefore, the scope of the invention is defined not by the detailed description of the invention but by the appended claims and all differences within the scope will be construed as being included in the present invention.

What is claimed is:

1. A data reading method comprising:
    detecting a data transition of a data signal input from an external source;
    generating a pulse signal corresponding to the detected data transition; and
    capturing the data signal by using the generated pulse signal as a trigger.

2. The method of claim 1, wherein the generating the pulse signal comprises determining a setup time which is an interval between a point in time of the detecting the data transition and a point in time of the capturing the data signal.

3. The method of claim 2, wherein the setup time is determined based on at least one of a buffer delay and an inverter delay.

4. The method of claim 1, further comprising inverting the generated pulse signal, wherein the capturing the data signal uses a rising edge of the inverted pulse signal as the trigger.

5. The method of claim 4, further comprising generating an initial pulse signal at a preamble period within a predetermined amount of time after a read command of the data signal is input.

6. The method of claim 5, wherein the generating the initial pulse signal comprises generating the initial pulse signal by corresponding to a preamble signal within a Column Address Strobe (CAS) delay time after the read command is input.

7. A data reading apparatus comprising:
    a data transition detecting unit which generates a pulse signal by detecting a data transition of a data signal input from an external source; and
    a data capturing flip-flop unit which captures the data signal by using the generated pulse signal as a trigger.

8. The data reading apparatus of claim 7, wherein the data transition detecting unit comprises a pulse signal generating unit which generates the pulse signal corresponding to the detected data transition.

9. The data reading apparatus of claim 8, wherein the pulse signal generating unit comprises a setup time computing unit which determines a setup time which is an interval between a point in time when the data transition is detected and a point in time when the data signal is captured.

10. The data reading apparatus of claim 9, wherein the setup time is determined based on at least one of a buffer delay and an inverter delay.

11. The data reading apparatus of claim 10, wherein the pulse signal generating unit further comprises an inverter which inverts the generated pulse signal.

12. The data reading apparatus of claim 11, wherein the data capturing flip-flop unit uses a rising edge of the inverted pulse signal as a trigger to capture the data signal.

13. The data reading apparatus of claim 12, further comprising an initial pulse signal generating unit which generates an initial pulse signal at a preamble period within a predetermined amount of time after a read command of the data signal is input.

14. The data reading apparatus of claim 13, wherein the initial pulse signal generating unit generates the initial pulse signal by corresponding to a preamble signal within a Column Address Strobe (CAS) delay time after the read command is input.

15. The data reading apparatus of claim 14, further comprising a data strobe signal detecting unit which detects data strobe signals generated from the read command.

16. The data reading apparatus of claim 15, wherein the data strobe signals generated from the read command comprise Data Queue Strobe (DQS) signals.

17. A program embodied on a computer readable recording medium, which when executed by a computer, the program causes the computer to perform a data reading method, the method comprising:

detecting a data transition of a data signal input from an external source;

generating a pulse signal corresponding to the detected data transition; and capturing the data signal by using the generated pulse signal as a trigger.

* * * * *